(12) United States Patent
Abdelmoula et al.

(10) Patent No.: US 9,997,700 B2
(45) Date of Patent: Jun. 12, 2018

(54) DETERMINISTIC SEEDING OF SWITCHING FILAMENT IN OXIDE-BASED MEMRISTIVE DEVICES

(71) Applicant: Carnegie Mellon University, Pittsburgh, PA (US)

(72) Inventors: Mohamed Abdeltawab Abdelmoula, Pittsburgh, PA (US); Marek Skowronski, Murrysville, PA (US); Abhishek A. Sharma, Pittsburgh, PA (US); James A. Bain, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 79 days.

(21) Appl. No.: 14/267,111

(22) Filed: May 1, 2014

(65) Prior Publication Data

US 2015/0318472 A1    Nov. 5, 2015

(51) Int. Cl.
*H01L 45/00*     (2006.01)

(52) U.S. Cl.
CPC ........ *H01L 45/085* (2013.01); *H01L 45/1233* (2013.01); *H01L 45/1246* (2013.01); *H01L 45/1253* (2013.01); *H01L 45/146* (2013.01); *H01L 45/165* (2013.01)

(58) Field of Classification Search
CPC ........... H01L 45/1641–45/1658; H01L 45/085
See application file for complete search history.

(56) References Cited

U.S. PATENT DOCUMENTS

| | | | | |
|---|---|---|---|---|
| 7,658,773 B2* | 2/2010 | Pinnow | ................. | H01L 45/165 257/E21.008 |
| 7,659,566 B2* | 2/2010 | Ahn | ........................ | H01L 45/04 257/298 |
| 2012/0202334 A1* | 8/2012 | Kochergin | ............ | H01L 45/165 438/382 |
| 2013/0193394 A1* | 8/2013 | Lengade | ............... | H01L 45/165 257/4 |
| 2015/0053908 A1* | 2/2015 | Fowler | .................... | H01L 45/04 257/4 |

OTHER PUBLICATIONS

"Electron beam processing", Wikipedia article retrieved Oct. 5, 2016, https://en.wikipedia.org/wiki/electron_beam_processing.*

* cited by examiner

*Primary Examiner* — Stephen W Smoot
*Assistant Examiner* — Sun M King
(74) *Attorney, Agent, or Firm* — Withrow & Terranova, P.L.L.C.

(57) ABSTRACT

A method for manufacturing an RRAM cell includes providing a metal-insulator-metal stack and exposing a subsection of a MIM stack to particle bombardment and/or radiation. Exposing a subsection of the MIM stack to particle bombardment and/or radiation forms localized defects in the functional layer of the MIM stack, thereby reducing the required forming voltage of the RRAM cell and further providing precise control over the location of a conductive filament created in the MIM stack during forming of the device.

7 Claims, 24 Drawing Sheets

DETERMINISTIC SEEDING OF SWITCHING FILAMENT IN OXIDE-BASED MEMRISTIVE DEVICES

GOVERNMENT SUPPORT

This invention was made with government funds under contract number DMR1105291 awarded by the National Science Foundation. The U.S. Government has certain rights in this invention.

FIELD OF THE DISCLOSURE

The present disclosure relates to resistive random access memory (RRAM) and methods for manufacturing the same.

BACKGROUND

The evolution of computing has resulted in an ever-increasing demand for improved memory technologies. Currently, one of the most promising memory technologies is resistive random access memory (RRAM), which combines the speed of static random access memory (SRAM), the non-volatility of flash memory, and the density of dynamic random access memory (DRAM) in a power efficient package. As shown in FIG. 1, an RRAM cell 10 typically includes a first metal electrode 12, a functional layer 14 over the first metal electrode 12, and a second metal electrode 16 over the functional layer 14. Since the functional layer 14 is often highly resistive layer, the structure of the RRAM cell 10 is often referred to as a metal-insulator-metal (MIM) stack. To set the state of the RRAM cell 10, a set voltage or a reset voltage is applied across the RRAM cell 10, which connects or disconnects the first metal electrode 12 and the second metal electrode 16 via a conductive filament in the functional layer 14. To read the contents of the RRAM cell 10, a small read voltage is used to measure the resistance, and thus the state, of the device. When the conductive filament between the first metal electrode 12 and the second metal electrode 16 is connected, the resistance of the RRAM cell 10 is low, indicating a first state of the RRAM cell 10. Conversely, when the conductive filament between the first metal electrode 12 and the second metal electrode 16 is disconnected, the resistance of the RRAM cell is high, indicating a second state of the RRAM cell 10. Because the conductive filament is thought to be very spatially localized (e.g., ~100 nm$^2$), and because the conductive filament is the only element necessary to accomplish the set and reset processes of the RRAM cell 10, RRAM cells are highly scalable, and may become as small as 5 nm.

As will be appreciated by those of ordinary skill in the art, a MIM stack is a highly resistive device that is incapable of storing data absent additional processing. In order to generate the RRAM cell 10, a one-time initialization step known as electro-forming (or simply forming) must be performed on the MIM stack, which permanently lowers the resistance of the device and forms the conductive filament in the functional layer 14. FIG. 2 illustrates a conventional process for initialization of the RRAM cell 10. First, a MIM stack is provided (step 100). A forming voltage significantly larger than the set voltage or the reset voltage of the RRAM cell 10 is then placed across the MIM stack for a predetermined period of time (step 102). Placing the forming voltage across the MIM stack is believed to generate one or more defects, generally in the form of oxygen vacancies, in the functional layer 14 of the RRAM cell 10. Specifically, placing the forming voltage across the MIM stack is believed to cause oxygen ions to migrate from the functional layer 14 into either the first metal electrode 12 and/or the second metal electrode 16, leaving behind a stack of oxygen vacancies which result in a low-resistance path (i.e., the conductive filament) between the first metal electrode 12 and the second metal electrode 16. The surplus of oxygen ions in the first metal electrode 12 and/or the second metal electrode 16 may migrate into functional layer and annihilate one or more of the oxygen vacancies when a reset voltage is applied across the RRAM cell 10, and may migrate out of the functional layer, leaving oxygen vacancies, when a set voltage is applied across the RRAM cell 10. As will be appreciated by those of ordinary skill in the art, the number of oxygen vacancies and/or their distribution in the functional layer may determine the resistance of the RRAM cell 10. Accordingly, the RRAM cell 10 may store data by changing between a high-resistance state and a low-resistance state. Once forming is complete, the RRAM cell 10 may then be integrated into a larger circuit or device (step 104).

Although effective at forming an RRAM cell 10 from a MIM stack, the conventional forming process discussed above suffers from many drawbacks. First, the conventional forming process requires a forming voltage significantly above the set voltage or the reset voltage of the RRAM cell 10. Accordingly, forming the RRAM cell 10 requires additional high-voltage circuitry integrated with the RRAM cell, and/or must be accomplished by an additional manufacturing step. Further, the conventional forming process results in the formation of the conductive filament at a random location within the functional layer 14. In other words, there is no way to control where the conductive filament will occur in the functional layer 14 when using the conventional forming process. In some cases where the conductive filament forms near an edge of the RRAM cell 10, the device may fail altogether, as the conductive filament may fail to change the resistance of the RRAM cell 10 in response to the set voltage or the reset voltage.

Accordingly, there is a need for an improved process for initialization of an RRAM cell that reduces and/or eliminates the requirement for a forming voltage, and further allows for precise control over the location of the conductive filament.

SUMMARY

The present disclosure relates to resistive random access memory (RRAM) and methods for manufacturing the same. According to one embodiment, a method for manufacturing an RRAM cell includes first providing a metal-insulator-metal (MIM) stack including a first metal electrode, a functional layer over the first metal electrode, and a second metal electrode over the functional layer, then exposing a subsection of a MIM stack to particle bombardment and/or radiation. Exposing the subsection of the MIM stack to particle bombardment and/or radiation forms localized defects in the functional layer of the MIM stack, thereby completely or partially forming a conductive filament in the functional layer within the subsection of the MIM stack. Using particle bombardment and/or radiation to completely or partially form the conductive filament in the functional layer within the subsection of the MIM stack effectively reduces the required forming voltage to initialize the RRAM cell, and further provides precise control over the location of the conductive filament. In one embodiment, the method allows the RRAM cell to be initialized with a voltage less than or equal to the set or reset voltage of the RRAM cell.

According to one embodiment, the method for manufacturing the RRAM cell further includes applying a forming voltage across the MIM stack to complete the formation of the conductive filament. In other various embodiments, electrons, ions, or photons are used to bombard the subsection of the MIM stack.

According to one embodiment, a method for manufacturing an RRAM cell includes providing a first metal electrode, providing a functional layer over the first metal electrode, and providing a hard mask over the functional layer, leaving a subsection of the functional layer exposed through the hard mask. The hard mask and the subsection of the functional layer exposed through the hard mask are then bombarded with particles and/or exposed to radiation. Finally, the hard mask is removed, and a second metal electrode is provided over the functional layer. Exposing the subsection of the functional layer to particle bombardment and/or radiation forms localized defects in the functional layer, thereby completely or partially forming a conductive filament in the subsection of the functional layer. Using particle bombardment and/or radiation to completely or partially form the conductive filament in the functional layer effectively reduces the required forming voltage of the resulting RRAM cell, and further provides precise control over the location of the conductive filament. In one embodiment, the method allows the RRAM cell to be initialized with a voltage less than or equal to the set or reset voltage of the RRAM cell.

According to one embodiment, the method for manufacturing the RRAM cell further includes applying a forming voltage across the first metal electrode and the second metal electrode to complete the formation of the conductive filament within the subsection of the functional layer. In other various embodiments, electrons, ions, or photons are used to bombard the subsection of the functional layer.

According to one embodiment, a method for manufacturing an RRAM cell includes providing a first metal electrode, providing a functional layer over the first metal electrode, providing a second metal electrode over the functional layer, and providing a hard mask over the second metal electrode, leaving a subsection of the second metal electrode exposed through the hard mask. The hard mask and the subsection of the second metal electrode are then bombarded with particles and/or exposed to radiation. Exposing the subsection of the second metal electrode to particle bombardment and/or radiation forms localized defects in the functional layer, thereby completely or partially forming a conductive filament in the subsection of the functional layer. Using particle bombardment and/or radiation to completely or partially form the conductive filament in the functional layer effectively reduces the required forming voltage of the resulting RRAM cell, and further provides precise control over the location of the conductive filament. In one embodiment, the method allows the RRAM cell to be initialized with a voltage less than or equal to the set or reset voltage of the RRAM cell.

According to one embodiment, the hard mask is removed from the second metal electrode. In an additional embodiment, the method for manufacturing the RRAM cell further includes applying a forming voltage across the first metal electrode and the second metal electrode to complete the formation of the conductive filament within the subsection of the functional layer. In other various embodiments, electrons, ions, or photons are used to bombard the subsection of the second metal electrode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
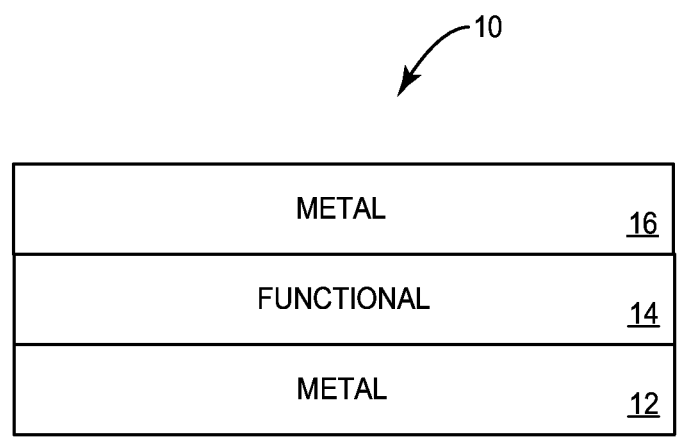
FIG. 1 shows a conventional metal-insulator-metal (MIM) stack.
Figure 2:
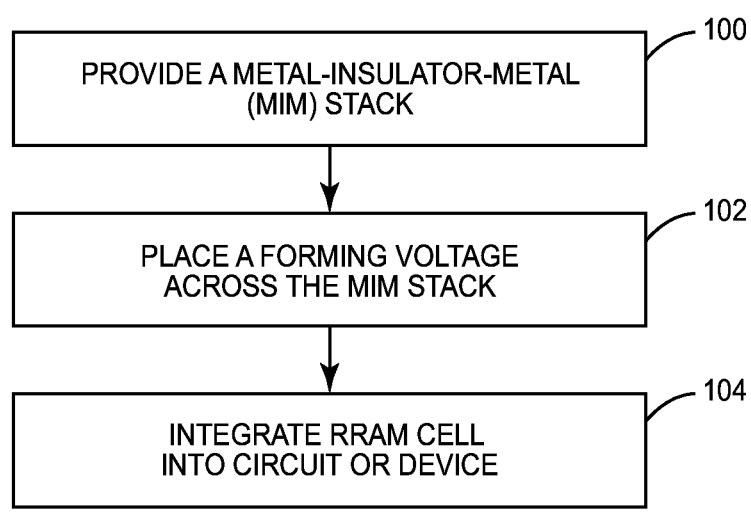
FIG. 2 is a block diagram illustrating a conventional process for generating a resistive random access memory (RRAM).
Figure 3:
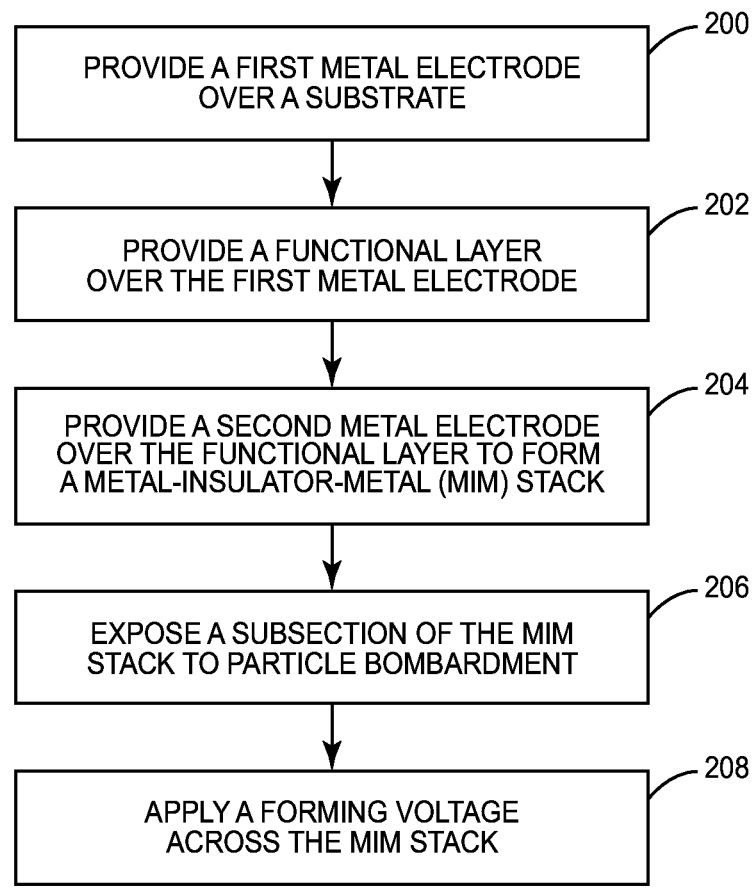
FIG. 3 is a block diagram illustrating a process for initialization of an RRAM cell according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Turning now to FIGS. 3 and 4A-4E, a process for manufacturing a resistive random access memory (RRAM) cell is shown according to one embodiment of the present disclosure. To begin, a first metal electrode 18 is provided over a substrate 20 (step 200 and FIG. 4A). The first metal electrode 18 may be provided, for example, by a deposition process. In one embodiment, the first metal electrode 18 is provided by radio frequency (RF) magnetron sputtering. In an additional embodiment, a lithography process is used to generate a desired geometry of the first metal electrode 18. Generating the first metal electrode 18 using a lithography process may include applying a photomask over the substrate 20, patterning the photomask to produce a desired geometry, depositing a blanket metal layer over the patterned photomask, for example, using RF magnetron sputtering, and etching away any undesired portions of the blanket metal layer via a chlorine (Cl) based reactive ion etching process before removing the photomask. The surface of the first metal electrode 18 may further be cleaned with oxygen (O) plasma to remove any remaining traces of the photomask. Those of ordinary skill in the art will appreciate that many different processes exist for providing the first metal electrode 18, all of which are contemplated herein.

The first metal electrode 18 may be, for example, titanium nitride (TiN) or platinum (Pt), however, those of ordinary skill in the art will appreciate that many suitable materials for the first metal electrode 18 exist, all of which are contemplated herein. In one embodiment, the first metal electrode 18 is about 30 nm thick. Further, the substrate 20 may be, for example, thermally oxidized silicon (Si) including a layer of silicon dioxide ($SiO_2$) on the surface of the substrate 20 on which the first metal electrode 18 is formed. In one embodiment, the layer of silicon dioxide ($SiO_2$) on the surface of the substrate 20 is about 1 μm thick. In an additional embodiment, the substrate 20 is a crystalline silicon (Si) substrate covered by a layer of aluminum nitride (AlN). Once again, those of ordinary skill in the art will appreciate that many suitable materials for the substrate 20 exist, all of which are contemplated herein.

Figure 4A:
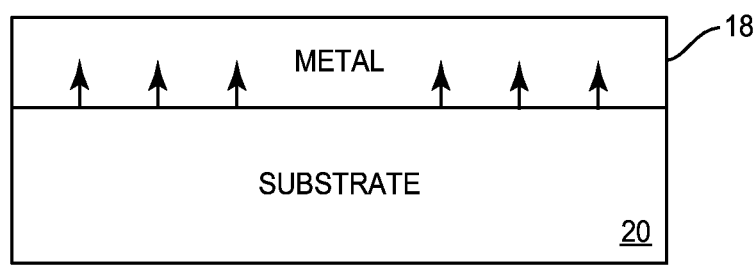
FIGS. 4A-4E illustrate the process described in the block diagram of FIG. 3 according to one embodiment of the present disclosure.
Figure 4B:
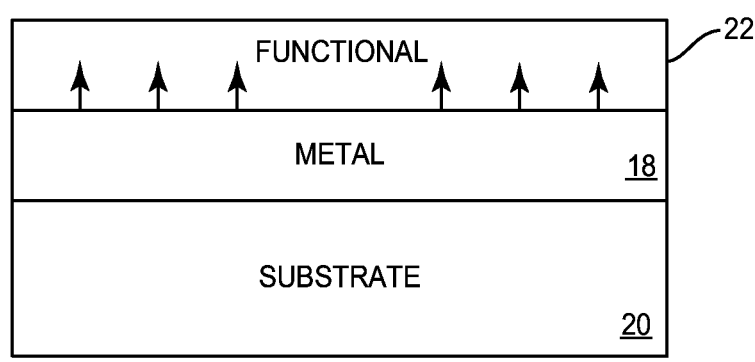
Figure 4C:
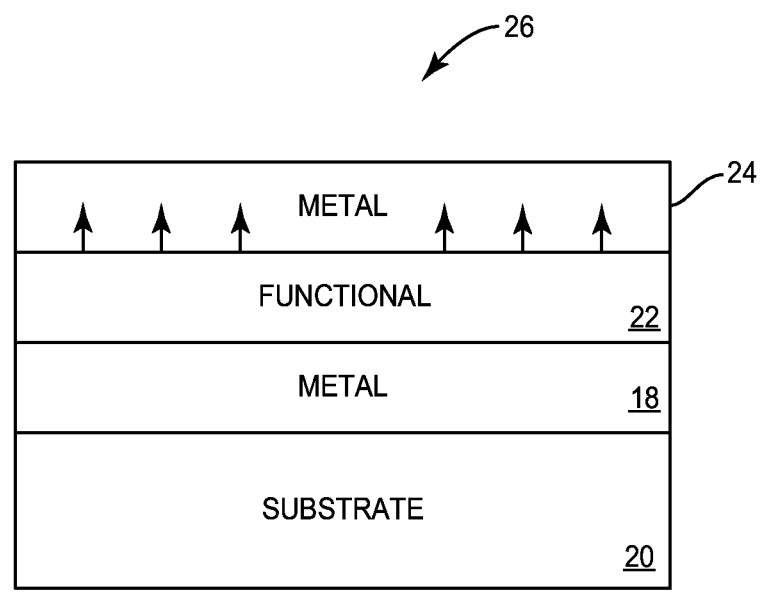

Next, a functional layer 22 is provided over the first metal electrode 18 (step 202 and FIG. 4B). The functional layer 22 may be provided, for example, by a deposition process. The functional layer 22 may be deposited via atomic layer deposition at around 200° C., or may be provided via a radio frequency (RF) sputtering or reactive sputtering process. In an additional embodiment, a lithography process is used to generate a desired geometry of the functional layer 22. Generating the functional layer 22 using a lithography process may include applying a photomask over the first metal electrode 18 and the substrate 20, patterning the photomask to produce a desired geometry, depositing a blanket functional layer 22 over the patterned photomask, for example, using atomic layer deposition, and removing any undesired portions of the functional layer 22 via an argon (Ar) milling process before removing the photomask. In yet another embodiment, a blanket functional layer 22 may be deposited on the first metal electrode 18 and then patterned using a lithography process. The surface of the functional layer 22 may further be cleaned with oxygen (O) plasma to remove any remaining traces of the photomask. Those of ordinary skill in the art will appreciate that many different processes exist for providing the functional layer 22, all of which are contemplated herein.

The functional layer 22 may be, for example, titanium dioxide ($TiO_2$), hafnium dioxide ($HfO_2$), tantalum oxide ($Ta_2O_5$), or the like. In one embodiment, the functional layer 22 includes multiple layers, each of which may be a different material. Those of ordinary skill in the art will appreciate that many suitable materials for the functional layer 22 exist, all of which are contemplated herein. In one embodiment, the functional layer 22 is about 15 nm thick.

A second metal electrode 24 is then provided over the functional layer 22 opposite the first metal electrode 18 (step 204 and FIG. 4C) to form a metal-insulator-metal (MIM) stack 26. The second metal electrode 24 may be provided, for example, by a deposition process. In one embodiment, the second metal electrode 24 is provided via a DC sputtering process. In an additional embodiment, a lithography process is used to generate a desired geometry of the second metal electrode 24. Generating the second metal electrode 24 using a lithography process may include applying a photomask over the functional layer 22 and the substrate 20, patterning the photomask to produce a desired geometry, depositing a blanket metal layer over the patterned photomask, for example, using DC sputtering, and removing any undesired portions of the functional layer via a liftoff process while removing the photomask. The surface of the second metal electrode 24 may further be cleaned with oxygen (O) plasma to remove any remaining traces of the photomask. Those of ordinary skill in the art will appreciate that many different processes exist for providing the second metal electrode 24, all of which are contemplated herein.

The second metal electrode 24 may be, for example, platinum (Pt) or titanium nitride (TiN), however, those of ordinary skill in the art will appreciate that many suitable materials exist for the second metal electrode 24, all of which are contemplated herein. In one embodiment, the second metal electrode 24 is about 20 nm thick. In an additional embodiment, the MIM stack 26 is less than about 100 nm by 100 nm.

Figure 4D:
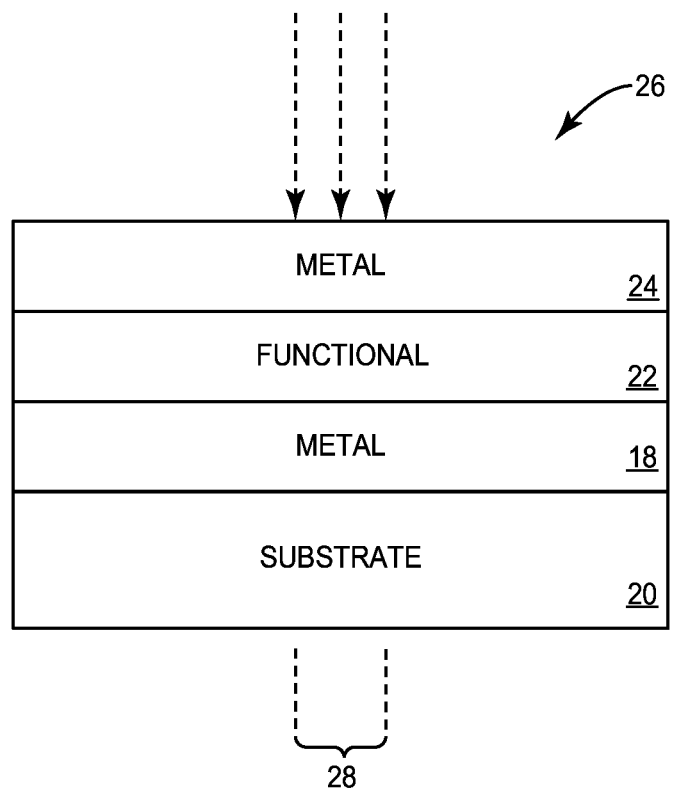
Figure 4E:
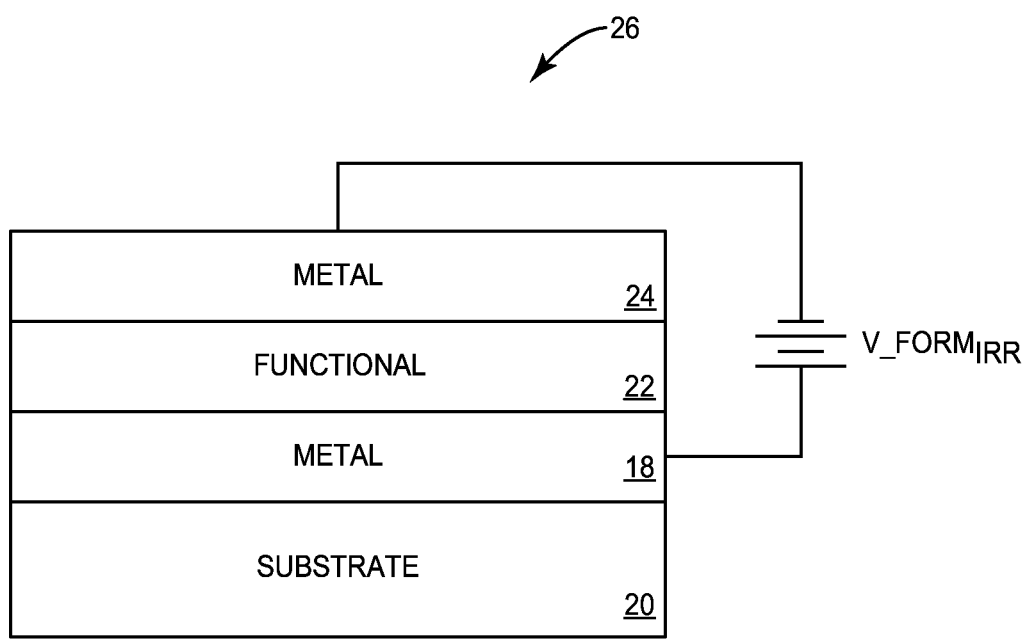
Figure 5:
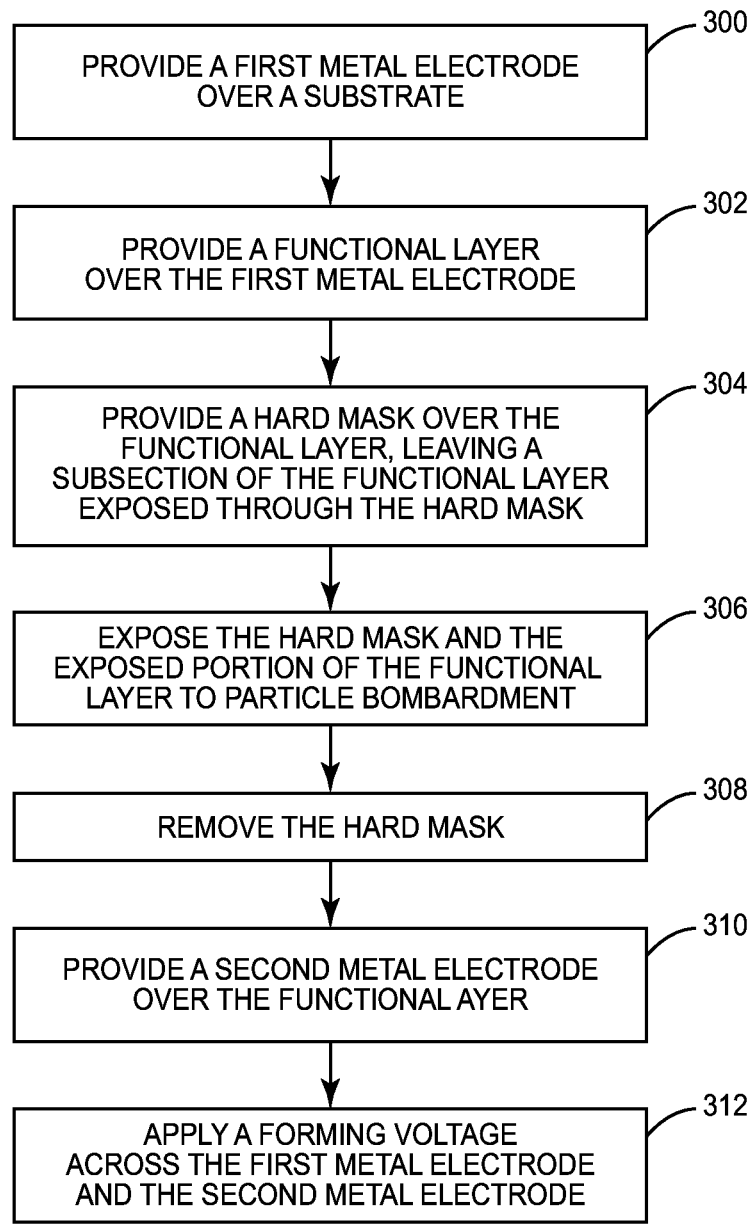
FIG. 5 is a block diagram illustrating a process for generating an RRAM cell according to an additional embodiment of the present disclosure.

A subsection 28 of the MIM stack 26 is then exposed to particle bombardment and/or radiation (step 206 and FIG. 4D). In one embodiment, the subsection 28 of the MIM stack 26 is exposed to electron bombardment. In an additional embodiment, the subsection 28 of the MIM stack 26 is exposed to ion bombardment, for example, by gallium (Ga) ions, hydrogen (H) ions, argon (Ar) ions, or titanium (Ti) ions. In yet another embodiment, the subsection 28 of the MIM stack 26 is exposed to photon bombardment. The particle bombardment and/or radiation exposure may occur, for example, by directing a particle beam, such as an electron beam, ion beam, or photon beam at the subsection of the MIM stack 26. In one embodiment, the particle bombardment is performed by a scanning electron microscope operating in a "spot" mode of operation.

Exposing the subsection 28 of the MIM stack 26 to particle bombardment and/or radiation generates defects, such as oxygen (O) vacancies, in an area of the functional layer 22 defined by the subsection 28 of the MIM stack 26. As discussed above, the defects effectively create a compositional gradient in the functional layer 22, thereby lowering the resistance of the functional layer 22 in the area within the subsection of the MIM stack 26 and at least partially generating a conductive filament, which connects the first metal electrode 18 and the second metal electrode 24. Generally, the subsection 28 of the MIM stack 26 is chosen to be at or near the center of the MIM stack 26, in order to generate a conductive filament in this area. As discussed above, generating the conductive filament too close to an edge of the MIM stack 26 may result in unreliability of a resulting RRAM cell. Accordingly, by generating the conductive filament at or near the center of the MIM stack 26, the reliable functionality of the MIM stack 26 as an RRAM cell can be ensured. The characteristics of the conductive filament can be altered by applying a set voltage or a reset voltage across the MIM stack 26, resulting in a low-resistance state or a high-resistance state depending on the voltage used. The MIM stack 26 may thus store data by switching between the low-resistance state and a high-resistance state, as discussed above.

According to one embodiment, the area of the subsection 28 is less than about 100 nm$^2$. The resistance across the RRAM cell after bombarding the MIM stack 26 with electrons may be less than about 3 MΩ. In an additional embodiment, the resistance across the RRAM cell after bombarding the MIM stack 26 with ions is less than about 0.1 MΩ.

In some embodiments, exposing the subsection 28 of the MIM stack 26 to particle bombardment and/or radiation only partially generates the conductive filament. Accordingly, an additional step wherein a forming voltage is placed across the MIM stack 26 (step 208 and FIG. 4E) may be required in order to complete formation of the conductive filament in the functional layer 22 within the subsection 28 of the MIM stack 26. Notably, if a forming voltage is required to complete formation of the conductive filament, it is significantly lower than that required by a conventional process for generating RRAM cells. Accordingly, the reduced forming voltage is referred to as an irradiated forming voltage (V_FORM$_{IRR}$). In one exemplary embodiment, the irradiated forming voltage (V_FORM$_{IRR}$) is less than about 60% of the forming voltage (V_FORM) required by a non-irradiated cell. In an additional embodiment, the irradiated forming voltage (V_FORM$_{IRR}$) is equal to or less than the set voltage and/or the reset voltage of the RRAM cell. For example, the irradiated forming voltage (V_FORM$_{IRR}$) may be less than or equal to 2.6 V, while the non-irradiated forming voltage V_FORM may be around or greater than 4.5V. The previously described process may thus enable the forming step to occur after the MIM stack 26 is integrated into a larger memory array, upon the first set or reset of the RRAM cell. That is, due to the process described above, the same circuitry used to provide the set voltage and/or the reset voltage may be used to provide the forming voltage, thereby foregoing the need for additional high-voltage circuitry and/or an additional manufacturing step for providing the forming voltage.

Although the foregoing process is illustrated in a number of discrete steps arranged in a particular order, those of ordinary skill in the art will appreciate that the process described above may be performed in any number of steps, and may be arranged in any particular order.

As will be appreciated by those of ordinary skill in the art, it may be impractical to use a particle beam such as an electron beam, an ion beam, or a photon beam in the manufacturing of an RRAM cell. Accordingly, FIGS. 5 and 6A-6G illustrate a process for manufacturing an RRAM cell according to an additional embodiment of the present disclosure. To begin, a first metal electrode 30 is provided over a substrate 32 (step 300 and FIG. 6A). The first metal electrode 30 may be provided, for example, by a deposition process. In one embodiment, the first metal electrode 30 is provided by RF magnetron sputtering. In an additional embodiment, a lithography process is used to generate a desired geometry of the first metal electrode 30. Generating the first metal electrode 30 using a lithography process may include applying a photomask over the substrate 32, patterning the photomask to produce a desired geometry, depositing a blanket metal layer over the patterned photomask, for example, using RF magnetron sputtering, and etching away any undesired portions of the blanket metal layer via a chlorine (Cl) based reactive ion etching process before removing the photomask. The surface of the first metal electrode 30 may further be cleaned with oxygen (O) plasma to remove any remaining traces of the photomask. Those of ordinary skill in the art will appreciate that many different processes exist for providing the first metal electrode 30, all of which are contemplated herein.

The first metal electrode 30 may be, for example, titanium nitride (TiN), however, those of ordinary skill in the art will appreciate that many suitable materials for the first metal electrode 30 exist, all of which are contemplated herein. In one embodiment, the first metal electrode 30 is about 30 nm thick. Further, the substrate 32 may be, for example, thermally oxidized silicon (Si) including a layer of silicon dioxide (SiO$_2$) on the surface of the substrate 32 on which the first metal electrode 30 is formed. In one embodiment, the layer of silicon dioxide (SiO$_2$) on the surface of the substrate 32 is about 1 μm thick. In an additional embodiment, the substrate 32 is a crystalline silicon (Si) substrate covered by a layer of aluminum nitride (AlN). Once again, those of ordinary skill in the art will appreciate that many suitable materials for the substrate 32 exist, all of which are contemplated herein.

Figure 6A:
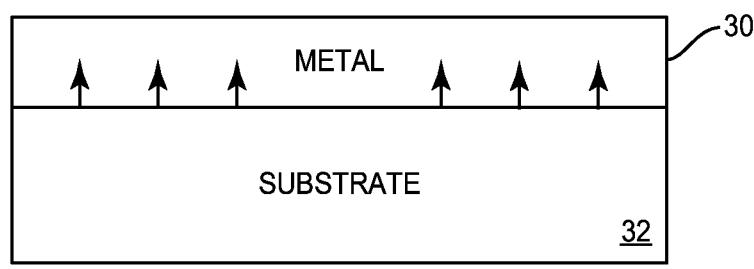
FIGS. 6A-6G illustrate the process described in the block diagram of FIG. 5 according to one embodiment of the present disclosure.
Figure 6B:
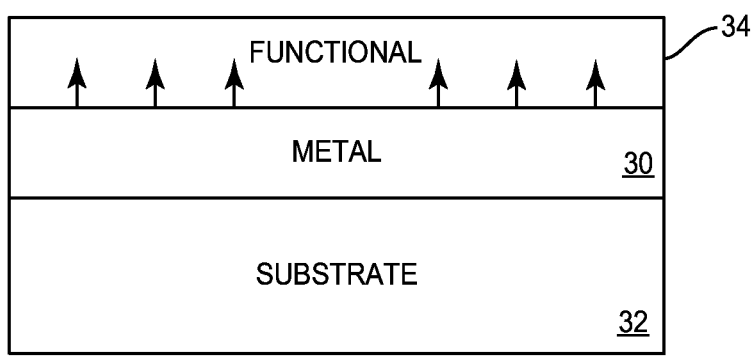

Next, a functional layer 34 is provided over the first metal electrode 30 (step 302 and FIG. 6B). In one embodiment, the functional layer 34 is deposited via atomic layer deposition at around 200° C. In an additional embodiment, a lithography process is used to generate a desired geometry of the functional layer 34. Generating the functional layer 34 using a lithography process may include applying a photomask over the first metal electrode 30 and the substrate 32, patterning the functional layer 34 to produce a desired geometry, depositing a blanket functional layer 34 over the patterned photomask, and removing any undesired portions of the blanket functional layer 34 via an argon (Ar) milling process before removing the photomask. In yet another embodiment, a blanket functional layer 34 may be deposited on the first metal electrode 30 and then patterned using a lithography process. The surface of the functional layer 34 may further be cleaned with oxygen (O) plasma to remove any remaining traces of the photomask. Those of ordinary skill in the art will appreciate that many different processes exist for providing the functional layer 34, all of which are contemplated herein.

The functional layer 34 may be, for example, titanium dioxide (TiO$_2$), hafnium dioxide (HfO$_2$), tantalum oxide (Ta$_2$O$_5$) or the like. In one embodiment, the functional layer 34 includes multiple layers, each of which may be a different material. Those of ordinary skill in the art will appreciate that many suitable materials for the functional layer 34 exist, all of which are contemplated herein. In one embodiment, the functional layer 34 is about 15 nm thick.

Figure 6C:
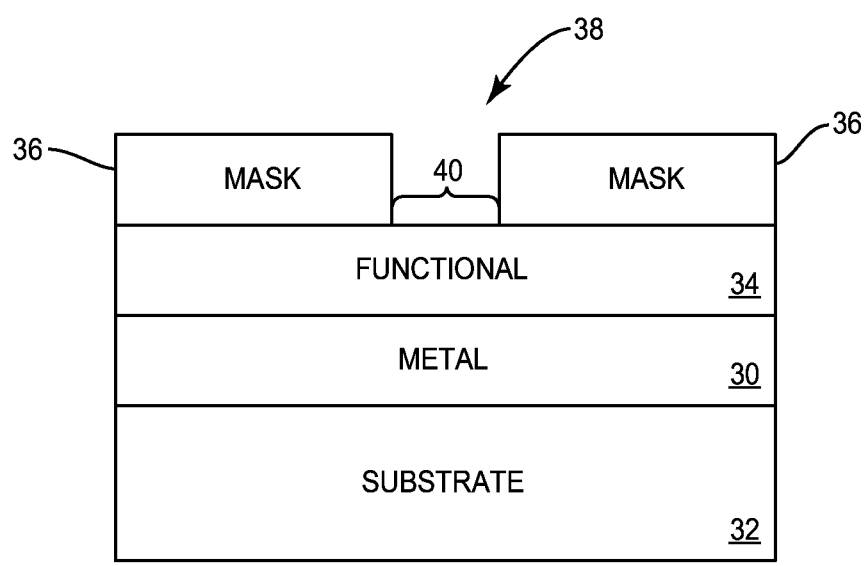

A hard mask 36 is then provided over the functional layer 34 opposite the first metal electrode 30 (step 304 and FIG. 6C). The hard mask 36 includes an opening 38, which exposes a subsection 40 of the functional layer 34 through the hard mask 36. The hard mask 36 may be placed on top of the functional layer 34, or may be generated by a lithography process. Notably, the hard mask 36 is resistant to radiation and particles such as electrons, ions, and photons, such that the hard mask 36 will prevent said radiation and particles from reaching the unexposed portions of the functional layer 34. In one embodiment, the hard mask 36 is nickel (Ni), however, those of ordinary skill in the art will appreciate that many suitable materials exist for the hard mask 36, all of which are contemplated herein.

Figure 6D:
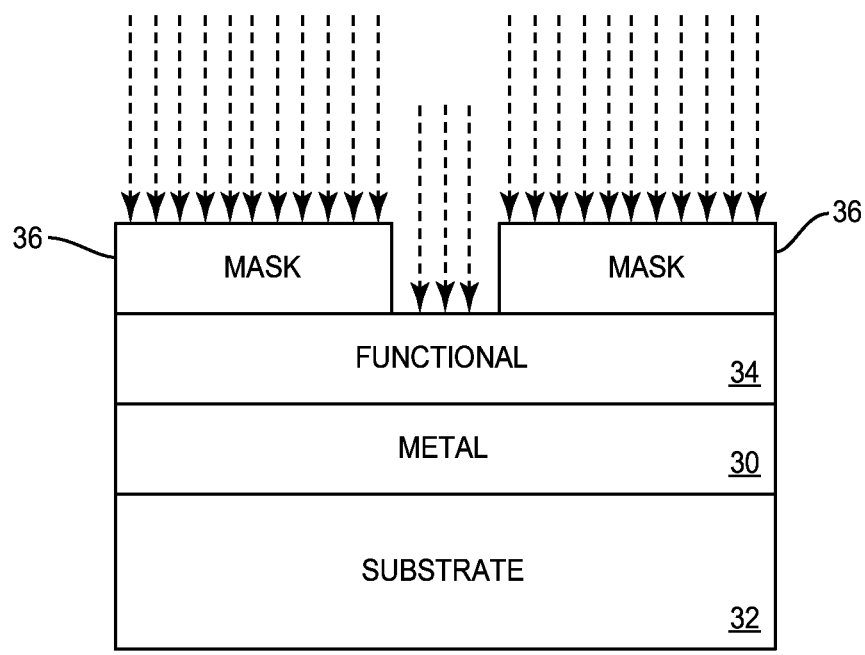
Figure 6E:
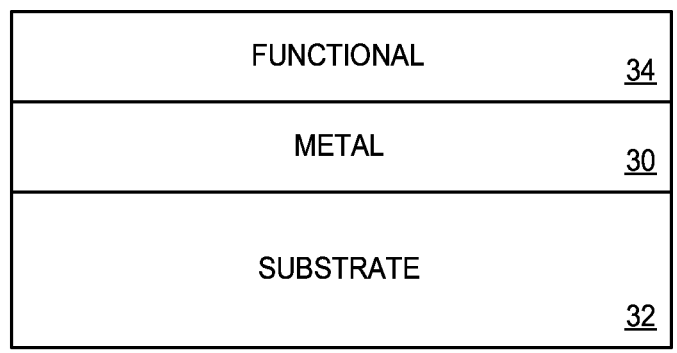
Figure 6F:
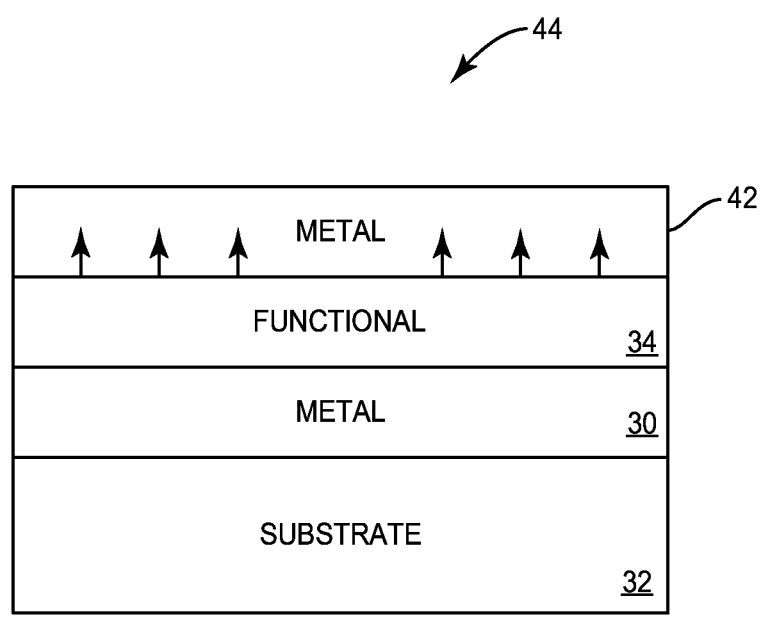
Figure 6G:
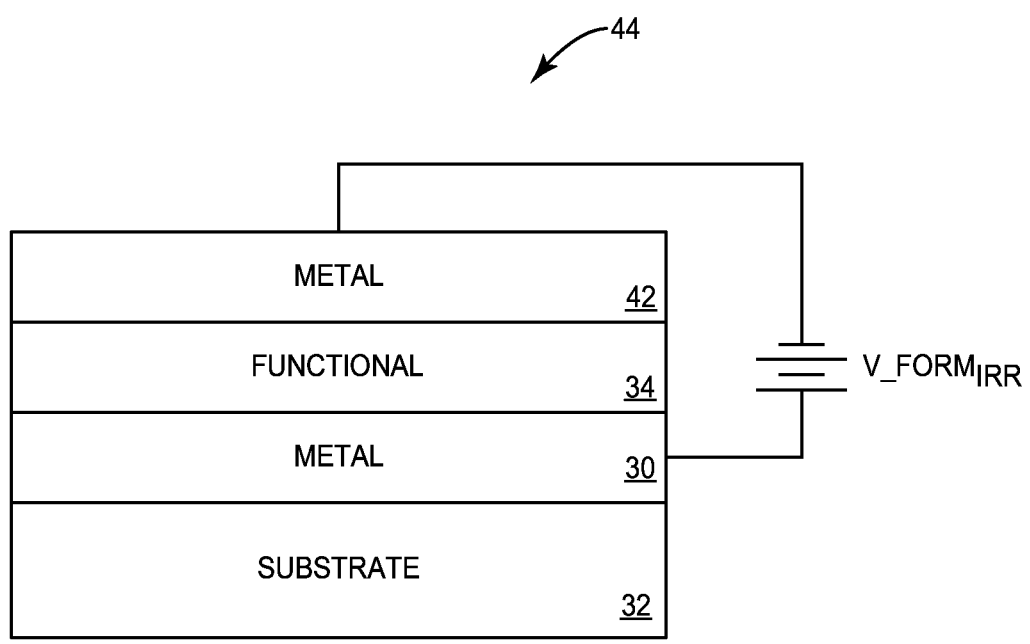
Figure 7:
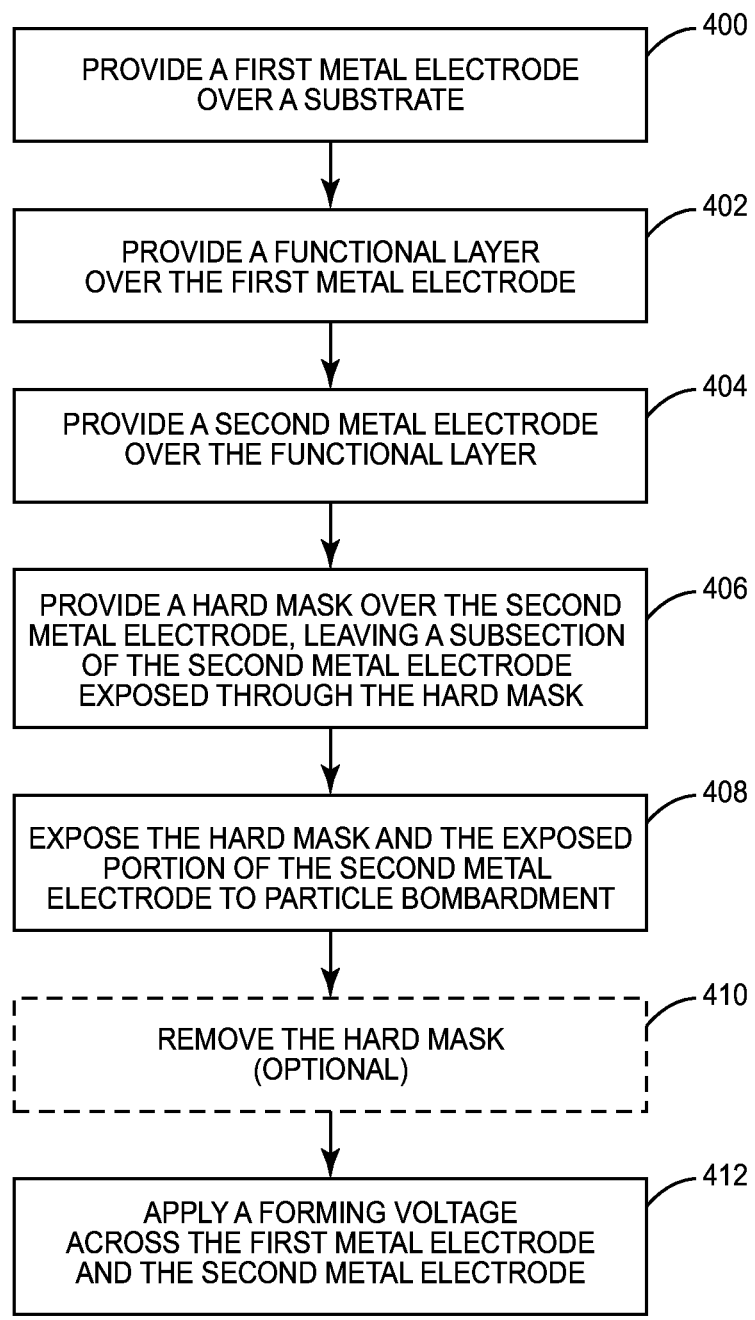
FIG. 7 is a block diagram illustrating a process for generating an RRAM cell according to an additional embodiment of the present disclosure.

The hard mask 36 and the exposed subsection 40 of the functional layer 34 are then bombarded with particles and/or exposed to radiation (step 306 and FIG. 6D). In one embodiment, the hard mask 36 and the exposed subsection 40 of the functional layer 34 are bombarded with electrons. In an additional embodiment, the hard mask 36 and the exposed subsection 40 of the functional layer 34 are bombarded with ions, for example, by gallium (Ga) ions, hydrogen (H) ions, argon (Ar) ions, or titanium (Ti) ions. Because the hard mask 36 is resistant to radiation and particles such as electrons, ions, and photons, the hard mask 36 operates as a barrier, preventing said radiation and particles from reaching the unexposed portions of the functional layer 34.

Exposing the subsection 40 of the functional layer 34 to particle bombardment and/or radiation generates defects in the subsection 40. The defects effectively create a compositional gradient in the functional layer 34, thereby lowering the resistance of the functional layer 34 in the area within the subsection 40 and at least partially generating a conductive filament between the first metal electrode 30 and the second metal electrode 42, as discussed in further detail below.

The hard mask 36 is then removed, for example, by an etching, grinding, or liftoff process (step 308 and FIG. 6E), and a second metal electrode 42 is provided over the functional layer 34 opposite the first metal electrode 30 (step 310 and FIG. 6F) to provide a MIM stack 44. In one embodiment, the hard mask 36 is not removed, and instead the second metal electrode 42 is provided over the hard mask 36. The second metal electrode 42 may be provided, for example, by a deposition process. In one embodiment, the second metal electrode 42 is provided by a DC sputtering process. In an additional embodiment, a lithography process is used to generate a desired geometry of the second metal electrode 42. Generating the second metal electrode 42 using a lithography process may include applying a photomask over the functional layer 34 and the substrate 32, patterning the photomask to produce a desired geometry, depositing a blanket metal layer over the patterned photomask, for example, using DC sputtering, and removing any undesired portions of the blanket metal layer using a liftoff process while removing the photomask. Those of ordinary skill in the art will appreciate that many different processes exist for providing the second metal electrode 42, all of which are contemplated herein.

The second metal electrode 42 may be, for example, platinum (Pt), however, those of ordinary skill in the art will appreciate that any suitable materials exist for the second metal electrode 42, all of which are contemplated herein. In one embodiment, the second metal electrode 42 is about 20 nm thick.

As discussed above, because the functional layer 34 is exposed to particle bombardment and/or radiation, a conductive filament is at least partially formed in the subsection 40 of the functional layer 34, which connects the first metal electrode 30 and the second metal electrode 42. Generally, the opening 38 of the hard mask 36, and thus the subsection 40 of the functional layer 34, is chosen to be at or near the center of the functional layer 34, in order to generate a conductive filament in this area. As discussed above, generating the conductive filament too close to an edge of the functional layer 34 may result in unreliability of the resulting RRAM cell. Accordingly, by generating the conductive filament at or near the center of the functional layer 34, the reliable functionality of the resulting RRAM cell can be ensured. The characteristics of the conductive filament can be altered by applying a set voltage or a reset voltage across the MIM stack 44, resulting in a low-resistance state or a high-resistance state depending on the voltage used. The MIM stack 44 may store data by switching between the low-resistance state and the high-resistance state, as discussed above.

According to one embodiment, the area of the subsection 40 is less than about 100 nm$^2$. The resistance across the RRAM cell after bombarding the MIM stack 44 with electrons may be less than about 3 MΩ. In an additional embodiment, the resistance across the RRAM cell after bombarding the MIM stack 44 with ions is less than about 0.1 MΩ

In some embodiments, exposing the subsection 40 of the functional layer 34 to particle bombardment and/or radiation only partially generates the conductive filament. Accordingly, an additional step wherein a forming voltage is placed across the MIM stack 44 (step 312 and FIG. 6G) may be required. Notably, if a forming voltage is required, it is significantly lower than that required by conventional processes for initialization of the RRAM cells. Accordingly, the reduced forming voltage is referred to as an irradiated forming voltage (V_FORM$_{IRR}$). In one exemplary embodiment, the irradiated forming voltage (V_FORM$_{IRR}$) is below 60% of the forming voltage (V_FORM) required by a non-irradiated cell. In an additional embodiment, the forming voltage (V_FORM$_{IRR}$) is equal to or less than the set voltage and/or the reset voltage of the RRAM cell. For example, the irradiated forming voltage (V_FORM$_{IRR}$) may less than or equal to 2.6 V, while the non-irradiated forming voltage V_FORM may be around or greater than 4.5V. Accordingly, the last forming step may occur upon the first set or reset operation of the RRAM cell without requiring additional high voltage circuitry to complete the forming process.

Although the foregoing process is illustrated in a number of discrete steps arranged in a particular order, those of ordinary skill in the art will appreciate that the process described above may be performed in any number of steps, and may be arranged in any particular order.

FIGS. 7 and 8A-8G illustrate a process for manufacturing an RRAM cell according to an additional embodiment of the present disclosure. To begin, a first metal electrode 46 is provided over a substrate 48 (step 400 and FIG. 8A). The first metal electrode 46 may be provided, for example, by a deposition process. In one embodiment, the first metal electrode 46 is provided by RF magnetron sputtering. In an additional embodiment, a lithography process is used to generate a desired geometry of the first metal electrode 46.

Generating the first metal electrode 46 using a lithography process may include applying a photomask over the substrate 48, patterning the photomask to produce a desired geometry, depositing a blanket metal layer over the patterned photomask, for example, using RF magnetron sputtering, and etching away any undesired portions of the blanket metal layer via a chlorine (Cl) based reactive ion etching process before removing the photomask. The surface of the first metal electrode 46 may further be cleaned with oxygen (O) plasma to remove any remaining traces of the photomask. Those of ordinary skill in the art will appreciate that many different processes exist for providing the first metal electrode 46, all of which are contemplated herein.

The first metal electrode 46 may be, for example, titanium nitride (TiN), however, those of ordinary skill in the art will appreciate that many suitable materials for the first metal electrode 46 exist, all of which are contemplated herein. In one embodiment, the first metal electrode 46 is about 30 nm thick. Further, the substrate 48 may be, for example, thermally oxidized silicon (Si) including a layer of silicon dioxide ($SiO_2$) on the surface of the substrate 48 on which the first metal electrode 46 is formed. In one embodiment, the layer of silicon dioxide ($SiO_2$) on the surface of the substrate 48 is about 1 μm thick. In an additional embodiment, the substrate 48 is a crystalline silicon (Si) substrate covered by a layer of aluminum nitride (AlN). Once again, those of ordinary skill in the art will appreciate that many suitable materials for the substrate 48 exist, all of which are contemplated herein.

Figure 8A:
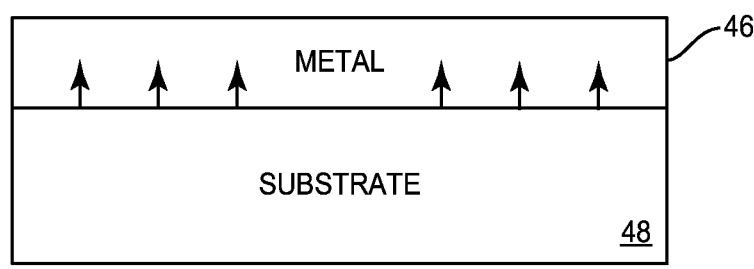
FIGS. 8A-8G illustrate the process described in the block diagram of FIG. 7 according to one embodiment of the present disclosure.
Figure 8B:
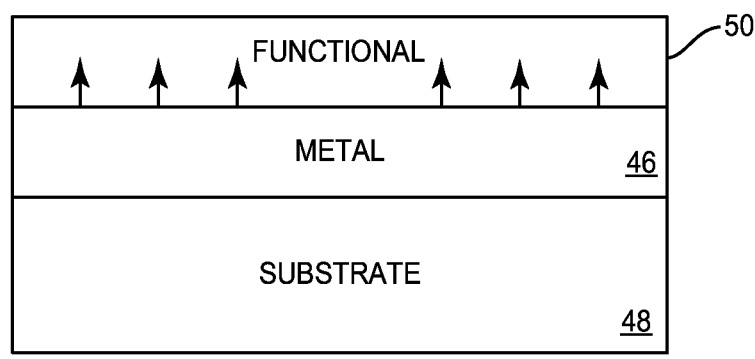
Figure 8C:
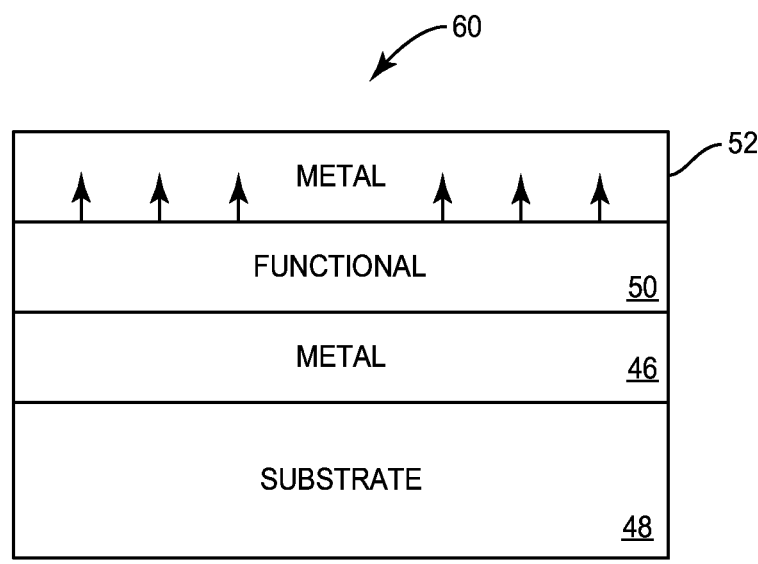

Next, a functional layer 50 is provided over the first metal electrode 46 (step 402 and FIG. 8B). In one embodiment, the functional layer 50 is deposited via atomic layer deposition at around 200° C. In an additional embodiment, a lithography process is used to generate a desired geometry of the functional layer 50. Generating the functional layer 50 using a lithography process may include applying a photomask over the first metal electrode 46 and the substrate 48, patterning the functional layer 50 to produce a desired geometry, depositing a blanket functional layer 50 over the patterned photomask, and removing any undesired portions of the blanket functional layer 50 via an argon (Ar) milling process before removing the photomask. In yet another embodiment, a blanket functional layer 50 may be deposited on the first metal electrode 46 and then patterned using a lithography process. The surface of the functional layer 50 may further be cleaned with oxygen (O) plasma to remove any remaining traces of the photomask. Those of ordinary skill in the art will appreciate that many different processes exist for providing the functional layer 50, all of which are contemplated herein.

The functional layer 50 may be, for example, titanium dioxide ($TiO_2$), hafnium dioxide ($HfO_2$), tantalum oxide ($Ta_2O_5$), or the like. In one embodiment, the functional layer 50 includes multiple layers, each of which may be a different material. Those of ordinary skill in the art will appreciate that many suitable materials for the functional layer 50 exist, all of which are contemplated herein. In one embodiment, the functional layer 50 is about 15 nm thick.

A second metal electrode 52 is then provided over the functional layer 50 opposite the first metal electrode 46 (step 404 and FIG. 8C) to create a MIM stack 60. The second metal electrode 52 may be provided, for example, by a deposition process. In one embodiment, the second metal electrode 52 is provided by a DC sputtering process. In an additional embodiment, a lithography process is used to generate a desired geometry of the second metal electrode 52. Generating the second metal electrode 52 using a lithography process may include applying a photomask over the functional layer 50 and the substrate 48, patterning the photomask to produce a desired geometry, depositing a blanket metal layer over the patterned photomask, for example, using DC sputtering, and removing any undesired portions of the blanket metal layer using a liftoff process while removing the photomask. Those of ordinary skill in the art will appreciate that many different processes exist for providing the second metal electrode 52, all of which are contemplated herein.

The second metal electrode 52 may be, for example, platinum (Pt), however, those of ordinary skill in the art will appreciate that many suitable materials exist for the second metal electrode 52, all of which are contemplated herein. In one embodiment, the second metal electrode 52 is about 20 nm thick.

Figure 8D:
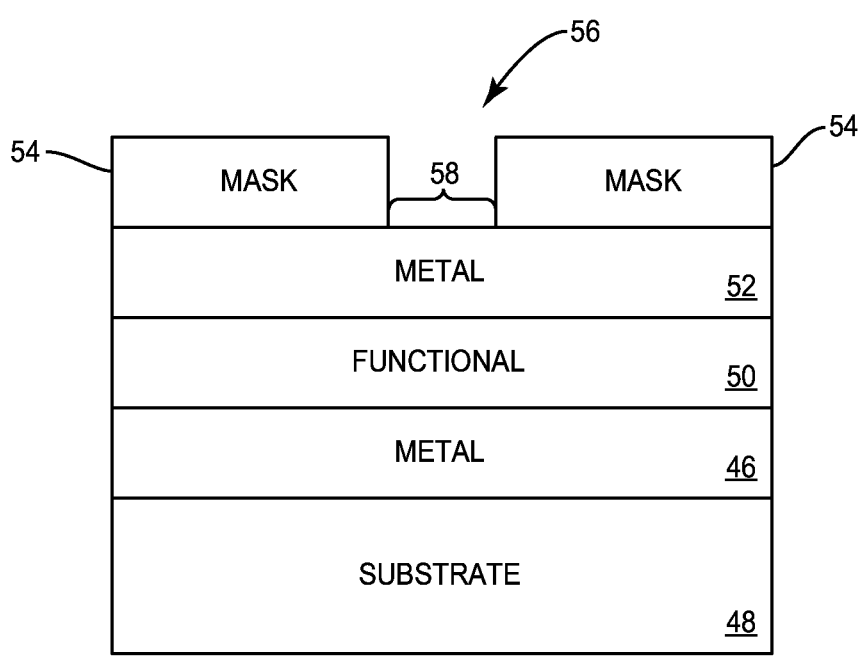

A hard mask 54 is then provided over the functional layer 50 opposite the first metal electrode 46 (step 406 and FIG. 8D). The hard mask 54 includes an opening 56, which exposes a subsection 58 of the second metal electrode 52 through the hard mask 54. The hard mask 54 may be placed on top of the second metal electrode 52, or may be generated by a lithography process. Notably, the hard mask 54 is resistant to radiation and particles such as electrons, ions, and photons, such that the hard mask 54 will prevent said radiation and particles from reaching the unexposed portions of the functional layer 50. In one embodiment, the hard mask 54 is nickel (Ni), however, those of ordinary skill in the art will appreciate that many suitable materials exist for the hard mask 54, all of which are contemplated herein.

Figure 8E:
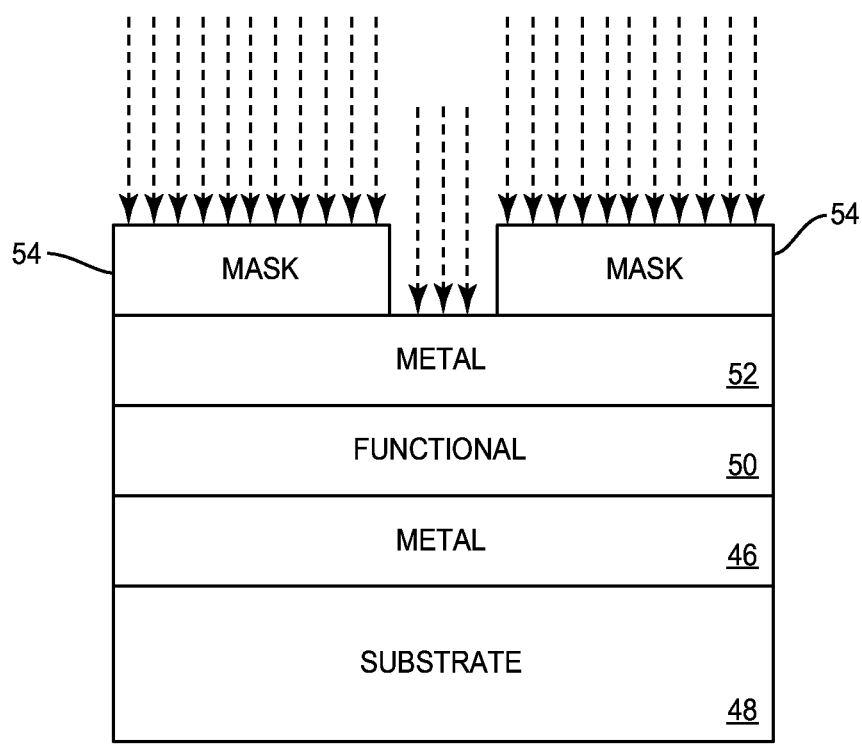

The hard mask 54 and the exposed subsection 58 of the second metal electrode 52 are then bombarded with particles and/or exposed to radiation (step 408 and FIG. 8E). In one embodiment, the hard mask 54 and the exposed subsection 58 of the second metal electrode 52 are bombarded with electrons. In an additional embodiment, the hard mask 54 and the exposed subsection 58 of the second metal electrode 52 are bombarded with ions, for example, by gallium (Ga) ions, hydrogen (H) ions, argon (Ar) ions, or titanium (Ti) ions. In yet another embodiment, the hard mask 54 and the exposed subsection 58 of the second metal electrode 52 are bombarded with photons. Because the hard mask 54 is resistant to radiation and particles such as electrons, ions, and photons, the hard mask 54 operates as a barrier, preventing said radiation and particles from reaching the unexposed portions of the second metal electrode 52.

Exposing the subsection 58 of second metal electrode 52 to particle bombardment and/or radiation generates defects in the functional layer 50 within the subsection 58. The defects effectively create a compositional gradient in the functional layer 50, thereby lowering the resistance of the functional layer 50 in the area within the subsection 58 and at least partially generating a conductive filament between the first metal electrode 46 and the second metal electrode 52, as discussed in further detail below.

According to one embodiment, the area of the subsection 58 is less than about 100 $nm^2$. The resistance across the RRAM cell after bombarding the MIM stack 60 with electrons may be less than about 3 MΩ. In an additional embodiment, the resistance across the RRAM cell after bombarding the MIM stack 60 with ions is less than about 0.1 MΩ

Figure 8F:
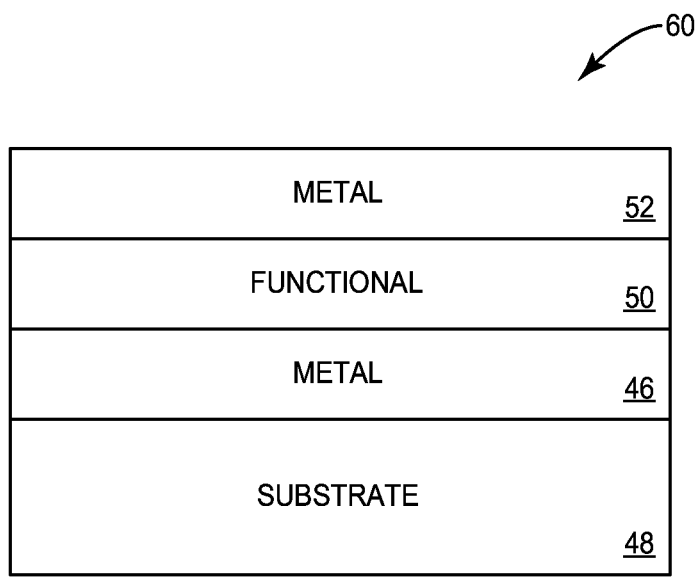
Figure 8G:
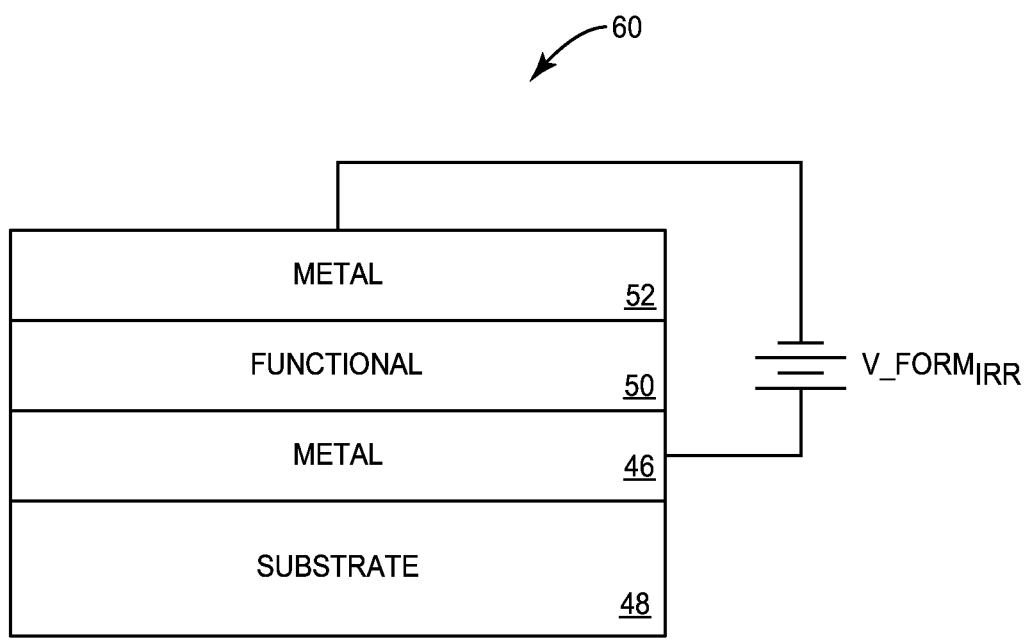

The hard mask 54 may then be removed, for example, by an etching, grinding, or liftoff process (step 410 and FIG. 8F). In one embodiment, the hard mask 54 is not removed, and remains on top of the second metal electrode 52. In some embodiments, exposing the subsection 58 of the functional layer 50 to particle bombardment and/or radiation only partially generates the conductive filament. Accordingly, an additional step wherein a forming voltage is placed across the MIM stack 60 (step 412 and FIG. 8G) may be required. Notably, if a forming voltage is required, it is significantly lower than that required by conventional processes for the initialization of RRAM cells. Accordingly, the reduced forming voltage is referred to as an irradiated forming voltage (V_FORM$_{IRR}$). In one exemplary embodiment, the irradiated forming voltage (V_FORM$_{IRR}$) is below 60% of the forming voltage (V_FORM) required by a non-irradiated cell. In an additional embodiment, the forming voltage (V_FORM$_{IRR}$) is equal to or less than the set voltage and/or the reset voltage of the RRAM cell. For example, the irradiated forming voltage (V_FORM$_{IRR}$) may be less than or equal to 2.6 V, while the non-irradiated forming voltage (V_FORM) may be around or greater than 4.5V. Accordingly, the last forming step may occur upon the first set or reset operation of the RRAM cell without requiring additional high voltage circuitry to complete the forming process.

Although the foregoing process is illustrated in a number of discrete steps arranged in a particular order, those of ordinary skill in the art will appreciate that the process described above may be performed in any number of steps, and may be arranged in any particular order.

Those skilled in the art will recognize improvements and modifications to the embodiments of the present disclosure. All such improvements and modifications are considered within the scope of the concepts disclosed herein and the claims that follow.

What is claimed is:

1. A method for manufacturing a resistive random access memory (RRAM) cell comprising:
   providing a metal-insulator-metal (MIM) stack comprising a first metal electrode, a second metal electrode, and a functional layer between the first metal electrode and the second metal electrode; and
   directing a particle beam only at a subsection of the MIM stack in order to generate only a portion of a conducting filament between the first metal electrode and the second metal electrode in the functional layer, wherein an area of the subsection of the MIM stack is less than 100 nm$^2$; and
   completing formation of the conductive filament by applying a forming voltage between the first metal electrode and the second metal electrode.

2. The method of claim 1 wherein the forming voltage is less than or equal to a set/reset voltage required to change a resistance between the first metal electrode and the second metal electrode of the RRAM cell.

3. The method of claim 1 wherein:
   the first metal electrode comprises titanium nitride (TiN);
   the functional layer comprises titanium oxide (TiO$_2$); and
   the second metal electrode comprises platinum (Pt).

4. The method of claim 1 wherein a resistance between the first metal electrode and the second metal electrode is less than 3 MΩ.

5. The method of claim 1 wherein the particle beam is an electron beam.

6. The method of claim 1 wherein the particle beam is an ion beam.

7. The method of claim 1 wherein the particle beam is a photon beam.

* * * * *